(12) United States Patent
Hou et al.

(10) Patent No.: US 11,630,430 B2
(45) Date of Patent: Apr. 18, 2023

(54) LATCHUP IMMUNE MICROCONTROLLER SYSTEM

(71) Applicant: Wuxi Institute of Technology, Wuxi (CN)

(72) Inventors: Ligong Hou, Wuxi (CN); Ying Xiao, Wuxi (CN); Wei Wu, Wuxi (CN); Ya Gao, Wuxi (CN)

(73) Assignee: WUXI INSTITUTE OF TECHNOLOGY, Wuxi (CN)

( * ) Notice: Subject to any disclaimer, the term of this patent is extended or adjusted under 35 U.S.C. 154(b) by 464 days.

(21) Appl. No.: 16/971,309

(22) PCT Filed: May 23, 2019

(86) PCT No.: PCT/CN2019/088139
§ 371 (c)(1),
(2) Date: Aug. 20, 2020

(87) PCT Pub. No.: WO2019/223762
PCT Pub. Date: Nov. 28, 2019

(65) Prior Publication Data
US 2020/0393804 A1    Dec. 17, 2020

(30) Foreign Application Priority Data

May 25, 2018    (CN) .......................... 201810513018.X (51) Int. Cl.
*G05B 19/042*    (2006.01)
*H03K 19/003*    (2006.01)
*G01R 31/28*    (2006.01)

(52) U.S. Cl.
CPC ...... *G05B 19/0423* (2013.01); *G01R 31/2853* (2013.01); *G05B 2219/25257* (2013.01);
(Continued)

(58) Field of Classification Search
CPC .... G01R 31/2853; G01R 19/00; G01R 22/00; G01R 23/00; H03K 19/00315;
(Continued)

(56) References Cited

U.S. PATENT DOCUMENTS

| | | | |
|---|---|---|---|
| 4,408,135 A | 10/1983 | Yuyama et al. | |
| 2001/0023489 A1* | 9/2001 | Liu | G06F 1/08 713/322 |

(Continued)

FOREIGN PATENT DOCUMENTS

| | | |
|---|---|---|
| CN | 103855682 A | 6/2014 |
| CN | 104503559 A | 4/2015 |

(Continued)

*Primary Examiner* — Kidest Bahta
(74) *Attorney, Agent, or Firm* — Bayramoglu Law Offices LLC (57) ABSTRACT

A latchup immune microcontroller system with a power supply and a filter designed to eliminate external risks of triggering a latchup of a microcontroller caused by the power supply; a clock circuit with a clock frequency and a layout for eliminating external risks of triggering a latchup of the microcontroller caused by a high-frequency clock signal; a reset circuit that uses an optical triggering mechanism acting as a common power supply and an isolated power supply, the power detection circuit and a discharge circuit react in chain in time, avoid risks of triggering latchups of the microcontroller caused by reset signals; an interrupt with a high priority level and the discharge circuit react in chain in time to enhance data security, and output terminals are turned off in sequence to remove external causes of latchup. An application method of an I/O port to eliminate triggers of latchup of the microcontroller.

7 Claims, 5 Drawing Sheets

(52) U.S. Cl.
CPC .............. *G05B 2219/34428* (2013.01); *H03K 19/00315* (2013.01)

(58) Field of Classification Search
CPC ...... H03K 19/00; H03K 3/00; G05B 19/0423; G05B 2219/25257; G05B 2219/34427; G05B 2219/34454
See application file for complete search history.

(56) References Cited

U.S. PATENT DOCUMENTS

2002/0164848 A1\* 11/2002 Lee ..................... H01L 27/0921
257/E21.642
2014/0048887 A1\* 2/2014 Hart .................... G11C 11/4125
257/E21.632

FOREIGN PATENT DOCUMENTS

| CN | 205229961 U | 5/2016 |
|----|-------------|--------|
| CN | 108445819 A | 8/2018 |
| CN | 208188628 U | 12/2018 |
| JP | 2006191045 A | 7/2006 |

\* cited by examiner

LATCHUP IMMUNE MICROCONTROLLER SYSTEM

CROSS-REFERENCE TO RELATED APPLICATIONS

This application is the national stage entry of International Application No. PCT/CN2019/088139, filed on May 23, 2019, which is based upon and claims priority to Chinese Patent Application No. 201810513018.X, filed on May 25, 2018, the entire contents of which are incorporated herein by reference.

TECHNICAL FIELD

The present invention relates to the field of electronics technology, and in particular to a latchup immune microcontroller system.

BACKGROUND

A complementary metal oxide semiconductor (CMOS) process has advantages such as low power consumption, a proportionless logic design, and a large noise margin, and becomes a preferred technology for a digital circuit, an analog circuit, and a hybrid circuit in which an analog circuit and a digital circuit are formed on the same chip. However, an inherent parasitic bipolar transistor in a CMOS structure may be activated when being triggered by some conditions to form a positive feedback to generate a latchup. As a result, a fault occurs in an integrated circuit (IC), leading to a change in data or a logic status, data loss or even a chip burnout in severe cases, causing a permanent circuit failure.

Currently, an IC layout process design can basically avoid the probability of a latchup in a chip. It is generally acknowledged at present in the industry that a latchup is mainly triggered by an external condition, that is, by the aspect of circuit application. The generally acknowledged external trigger conditions that tend to cause an IC latchup mainly include factors such as an external signal or noise interference, especially, a signal inversion at an input/output (I/O) pin of a chip, a voltage at an I/O pin being greater than a supply voltage of a device or lower than a ground voltage, a voltage or current at an I/O pin changing excessively fast, and a surge or drop at a power pin of a device. Applications of modern CMOS circuits, especially various microprocessors represented by embedded control, grow geometrically. During prototype debugging and system application, various errors such as software running out, data loss, and parameter change often occur. To resolve such problems, with errors in software itself being excluded, because of the variety and complexity of actual application circuits and external environments, problems may still exist even though many engineers have adopted many foregoing measures of avoiding a latchup.

SUMMARY

External factors such as a signal inversion at an I/O pin of a chip, a voltage at an I/O pin being greater than a supply voltage of a device or lower than a ground voltage, a voltage or current at an I/O pin changing excessively fast, and a surge or drop at a power pin of a device trigger an IC latchup, leading to errors during prototype debugging and system application.

A latchup immune microcontroller system includes a microcontroller, a clock circuit, a power supply circuit, a reset circuit, and an input signal processing circuit, where the clock circuit includes a first capacitor, a crystal oscillator, and a second capacitor that are sequentially connected in series, two ends of the series circuit are connected, a common terminal of the first capacitor and the crystal oscillator is connected to an XTAL1 pin of the microcontroller, a common terminal of the crystal oscillator and the second capacitor is connected to an XTAL2 pin of the microcontroller, and a common terminal of the first capacitor and the second capacitor is connected to a ground of direct-current stabilized power supply;

the power supply circuit includes a direct-current stabilized power supply and a filter circuit, the filter circuit includes a third capacitor, a filter inductor, and a fourth capacitor that are sequentially connected in series, two ends of the series circuit are connected, a common terminal of the third capacitor and the filter inductor is connected as an input terminal of the filter circuit to the direct-current stabilized power supply, a common terminal of the filter inductor and the fourth capacitor is connected as an output terminal of the filter circuit to a VCC pin of the microcontroller, and a common terminal of the third capacitor and the fourth capacitor is connected to a GND pin of the microcontroller and is connected to the ground of direct-current stabilized power supply;

the reset circuit includes a first-order reset circuit, a power detection circuit, and a discharge circuit, the first-order reset circuit includes a first reset element and a second reset element, one end of the first reset element is connected to the direct-current stabilized power supply, the other end of the first reset element is connected to one end of the second reset element, the other end of the second reset element is connected to the ground of direct-current stabilized power supply, the power detection circuit is connected to the discharge circuit by an optocoupler, the power detection circuit includes a fifth capacitor, a first diode, and a light-emitting diode that is located inside the optocoupler, an anode of the first diode and a cathode of the light-emitting diode are separately connected to a detection power supply, a positive electrode of the fifth capacitor and a cathode of the first diode are separately connected to an anode of the light-emitting diode, a negative electrode of the fifth capacitor is connected to a detection power ground, the discharge circuit includes a bipolar phototransistor inside the optocoupler and the second reset element in the first-order reset circuit, an emitter of the bipolar phototransistor is connected to the ground of direct-current stabilized power supply, a collector of the bipolar phototransistor is connected to a common terminal of the first reset element and the second reset element, the common terminal of the first reset element and the second reset element is further connected to an RST pin of the microcontroller, the common terminal of the first reset element and the second reset element is further connected to an input terminal of a CMOS buffer, and an output terminal of the CMOS buffer is connected to an external interrupt of the microcontroller, where the first reset element is a reset resistor, and the second reset element is a reset capacitor, or the first reset element is a reset capacitor, and the second reset element is a reset resistor; and the input signal processing circuit includes a first resistor, a second resistor, a sixth capacitor, a third resistor, a fourth resistor, and a comparator, one end of the first resistor is connected to an input signal, the other end of the first resistor is separately connected to one end of the second resistor, one end of the sixth capacitor, and a positive input terminal of the comparator, the other end of the second resistor is connected to the direct-current stabilized power supply, the other end of the sixth capacitor is connected to the ground of direct-current stabilized power supply, one end of the third resistor is connected to the direct-current stabilized power supply, the other end of the third resistor is connected to one end of the fourth resistor, the other end of the fourth resistor is connected to the ground of direct-current stabilized power supply, a common terminal of the third resistor and the fourth resistor is connected to a negative input terminal of the comparator and provides a reference voltage, and an output terminal of the comparator is connected to a signal input terminal of the microcontroller.

In a further technical solution of the system, the direct-current stabilized power supply is formed by processing utility power, the utility power is transformed to obtain a low-voltage power supply, the low-voltage power supply is rectified to obtain a direct-current power supply, and the direct-current power supply is stabilized to obtain the direct-current stabilized power supply;

when the duration during which an output change of the direct-current stabilized power supply lags behind an output change of the utility power does not reach preset duration, the detection power supply is the direct-current stabilized power supply, and the detection power ground is the ground of direct-current stabilized power supply; and when the duration during which the output change of the direct-current stabilized power supply lags behind the output change of the utility power reaches the preset duration, the detection power supply is the direct-current power supply, and the detection power ground is the direct-current power ground.

In a further technical solution of the system, the utility power passes through a switched-mode power supply to obtain the direct-current stabilized power supply; or the utility power sequentially passes through a transformer and a linear power supply to obtain the direct-current stabilized power supply, the transformer includes a shielding layer, the shielding layer is grounded, the secondary of the transformer includes a plurality of power loops formed by windings, and the power loops do not have a common ground.

In a further technical solution of the system, a clock frequency of the clock circuit is a frequency determined by adding a preset margin to a measured frequency, and the measured frequency is a frequency calculated according to a minimum time of completing real-time events by the microcontroller system.

In a further technical solution of the system, when the microcontroller system uses printed circuit board (PCB) wiring, the crystal oscillator in the clock circuit is close to the microcontroller, and a housing of the crystal oscillator is grounded, the outside of the clock circuit is surrounded by a grounding wire, and no other signal wire is arranged below the clock circuit.

In a further technical solution of the system, when the microcontroller is a low-level reset microcontroller, the first reset element in the first-order reset circuit is a reset resistor, and the second reset element is a reset capacitor, where a positive electrode of the reset capacitor is connected to one end of the reset resistor, a negative electrode of the reset capacitor is connected to the ground of direct-current stabilized power supply, the other end of the reset resistor is connected to the direct-current stabilized power supply, and the first-order reset circuit forms a first-order integrated reset circuit; and when the microcontroller is a high-level reset microcontroller, the first reset element in the first-order reset circuit is a reset capacitor, and the second reset element is a reset resistor, where a positive electrode of the reset capacitor is connected to the direct-current stabilized power supply, a negative electrode of the reset capacitor is connected to one end of the reset resistor, the other end of the reset resistor is connected to the ground of direct-current stabilized power supply, and the first-order reset circuit forms a first-order differential reset circuit.

In a further technical solution of the system, an optocoupler element is used to perform isolated transmission of an input signal and an output signal of the microcontroller, one transistor-transistor logic (TTL) port of the microcontroller drives at most eight TTL ports or 10 CMOS ports, one CMOS port of the microcontroller drives at most two TTL ports and 20 CMOS ports, and an idle pin of the microcontroller is set to output or is connected to the direct-current stabilized power supply by a pull-up resistor or is connected to the ground of direct-current stabilized power supply by a pull-down resistor.

The latchup immune microcontroller system disclosed in this application includes a power supply circuit design, a clock circuit design, a reset circuit design, and an I/O port design outside a microcontroller. Measures are adopted in various aspects such as a power supply of the system, a clock, resetting, and an I/O port to effectively avoid a risk of triggering a latchup of the microcontroller caused by an external condition. The selection of a power supply and a filter design method of the power supply are used to eliminate an external risk of triggering a latchup of the microcontroller caused by the aspect of a power supply. The selection of a clock frequency and a layout method of a clock circuit are used to eliminate an external risk of triggering a latchup of the microcontroller caused by the aspect of a high-frequency clock signal. A reset circuit designed by using an "optical trigger" mechanism has application compatibility of a "common power supply" and an "isolated power supply", so that a power detection circuit and a discharge circuit react in chain in time, thereby effectively avoiding a risk of triggering a latchup of the microcontroller caused by a reset signal. An interrupt with a high priority level and the discharge circuit react in chain in time to ensure data security, and output terminals are turned off in sequence to effectively remove an external formation condition of a latchup of the microcontroller. An effective application method of an I/O port is used to eliminate an external risk of triggering a latchup of the microcontroller caused by the aspect of an I/O port.

DETAILED DESCRIPTION

Specific implementations of the present invention are further described below with reference to the accompanying drawings.

Figure 1:
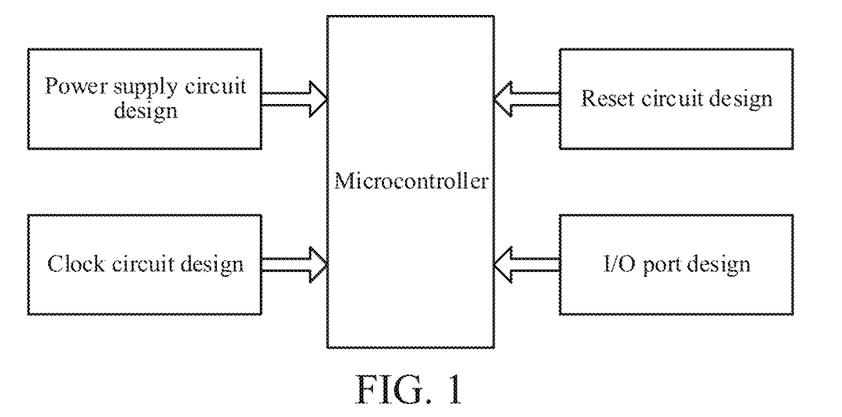
FIG. 1 is a schematic diagram of a general design solution of a latchup immune microcontroller system according to this application.

This application discloses a latchup immune microcontroller system. Measures are adopted in various aspects such as a power supply design, a clock circuit design, a reset circuit design, and an I/O port design in the system to effectively avoid a risk of triggering a latchup of a microcontroller caused by an external condition. A general design solution of the system is shown in FIG. 1. The four aspects are separately described in this application.

1. Power Supply Circuit Design

With the development of semiconductor technology and the increase in portable application requirements, current microcontroller products have a wider operating voltage range (usually 1.8 V to 6 V) and lower power consumption (usually less than 30 mA). Some designers tend to misapprehend that there is no strict requirement in terms of a power supply for supplying power to a microcontroller. In fact, operating currents provided in the data manual are merely average values. In an extreme case, for example, a case in which all I/O ports of the microcontroller simultaneously undergo a status change, large fluctuations are generated in a power output, and an instantaneous peak current may be up to hundreds of milliamperes. Therefore, a power supply circuit is designed by using the following method in this application.

A power supply circuit part mainly includes a direct-current stabilized power supply VCC and a filter circuit. The direct-current stabilized power supply VCC is formed by processing utility power. The utility power is transformed to obtain a low-voltage power supply VB. The low-voltage power supply VB is rectified to obtain a direct-current power supply VZ. The direct-current power supply VZ is stabilized to obtain the direct-current stabilized power supply VCC. In the process of forming the direct-current stabilized power supply VCC:

(1) It is necessary to provide the direct-current power supply VZ with sufficient power and stable amplitude.

(2) If there is a mature switched-mode power supply design or an appropriate switched-mode power supply is commercially available, the utility power directly passes through the switched-mode power supply to obtain the direct-current stabilized power supply VCC.

(3) If there is no mature switched-mode power supply design and no appropriate switched-mode power supply is commercially available, a conventional "transformer+linear power supply" manner is used. The utility power sequentially passes through a transformer and a linear power supply to obtain the direct-current stabilized power supply VCC. In this manner, during the customization or purchasing of the transformer, it is required that the transformer has a shielding layer, and a shielding terminal led out from the shielding layer is grounded. A plurality of windings should be selected according to a power supply requirement of the system for the secondary of the transformer to form power loops. The power loops do not have a common ground.

Figure 2:
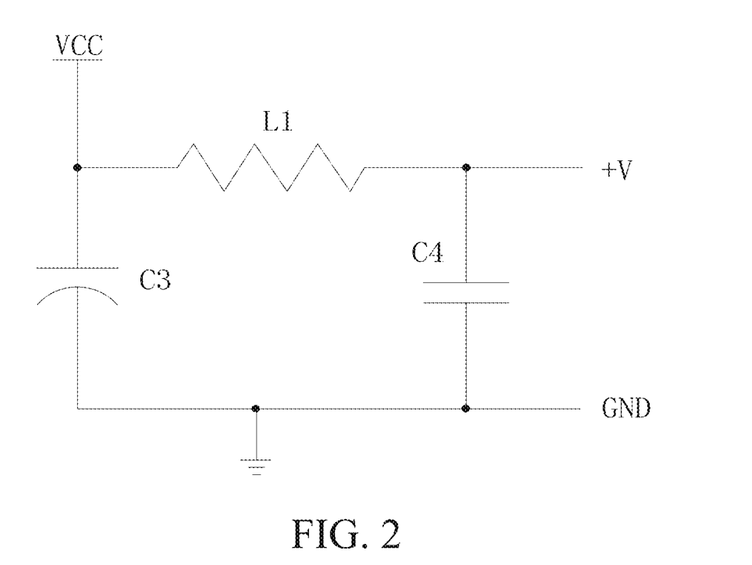
FIG. 2 is a circuit diagram of a filter circuit in a power supply circuit design.

The obtained direct-current stabilized power supply VCC is connected to the filter circuit shown in FIG. 2. The filter circuit includes a third capacitor C3, a filter inductor L1, and a fourth capacitor C4 that are sequentially connected in series. Two ends of the series circuit are connected. A common terminal of the third capacitor C3 and the filter inductor L1 is connected as an input terminal of the filter circuit to the direct-current stabilized power supply VCC. A common terminal of the filter inductor L1 and the fourth capacitor C4 is connected as an output terminal of the filter circuit to a VCC pin (a main power supply pin) of the microcontroller as a power supply. In this application, for distinguishing, +V represents the VCC pin of the microcontroller. The filter circuit can effectively absorb a peak pulse signal in the direct-current stabilized power supply VCC, and eliminate an external risk of triggering a latchup of the microcontroller caused by the aspect of a power supply. A common terminal of the third capacitor C3 and the fourth capacitor C4 is connected to a GND pin of the microcontroller and is connected to a ground of the direct-current stabilized power supply.

2. Clock Circuit Design

Figure 3:
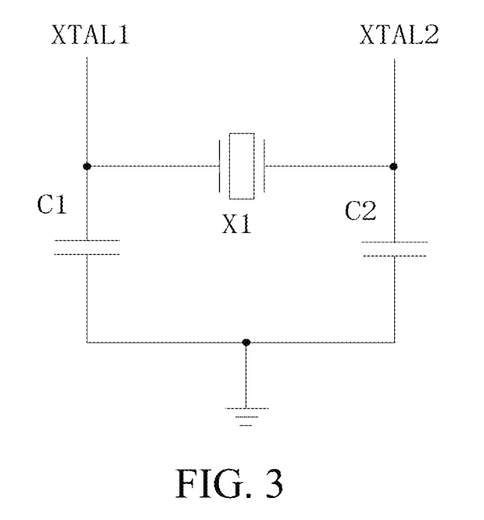
FIG. 3 is a circuit diagram of a clock circuit in a clock circuit design.

Refer to FIG. 3 for the circuit diagram of a clock circuit used in this application. The clock circuit includes a first capacitor C1, a crystal oscillator X1, and a second capacitor C2 that are sequentially connected in series. Two ends of the series circuit are connected. A common terminal of the first capacitor C1 and the crystal oscillator X1 is connected to an XTAL1 pin of the microcontroller. A common terminal of the crystal oscillator X1 and the second capacitor C2 is connected to an XTAL2 pin of the microcontroller. A common terminal of the first capacitor C1 and the second capacitor C2 is connected to a ground of direct-current stabilized power supply.

Under the premise of satisfying a functional requirement of the microcontroller system, the clock circuit should minimize a clock frequency, to help to improve the latchup immunity of the microcontroller. The method for determining a clock frequency in this application is as follows:

(1) Real-time events that need to be processed, for example, interruption and timing, are listed first.

(2) The time required for completing these real-time events by the microcontroller is measured to confirm a minimum time allowed by the microcontroller system to complete these real-time events.

(3) A required clock frequency is measured according to the determined time. The clock frequency is a measured frequency.

(4) A preset margin is added to the measured frequency to obtain a clock frequency of the microcontroller system. The preset margin may be customized. For example, it is set to add 20% to 30% to the measured frequency to obtain the clock frequency.

For high-frequency characteristics of the clock circuit, during PCB wiring in the microcontroller system, the following method should be used:

(1) The crystal oscillator should be as close to the microcontroller as possible. A lead wire needs to be short.

(2) It is optimal to surround the clock circuit with grounding wires.

(3) A housing of the crystal oscillator is grounded.

(4) No other signal wire is arranged below the clock circuit.

Figure 4:
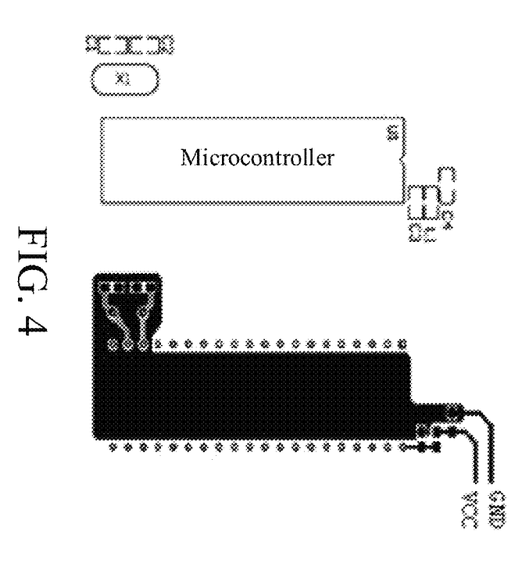
FIG. 4 is a schematic diagram of position arrangement and wiring of a power supply circuit, a clock circuit, and a microcontroller.

For example, the most cost-effective commercially available dual in-line package (DIP) is packaged with an MCS-51 series microcontroller. Refer to FIG. 4 for a schematic diagram of position arrangement and wiring used in PCB layout and wiring of the power supply circuit and the clock circuit of the microcontroller.

3. Reset Circuit Design

Figure 5:
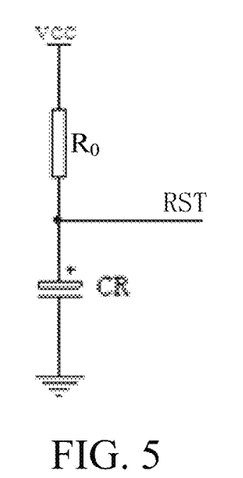
FIG. 5 is a circuit diagram of a reset circuit of an existing microcontroller.
Figure 6:
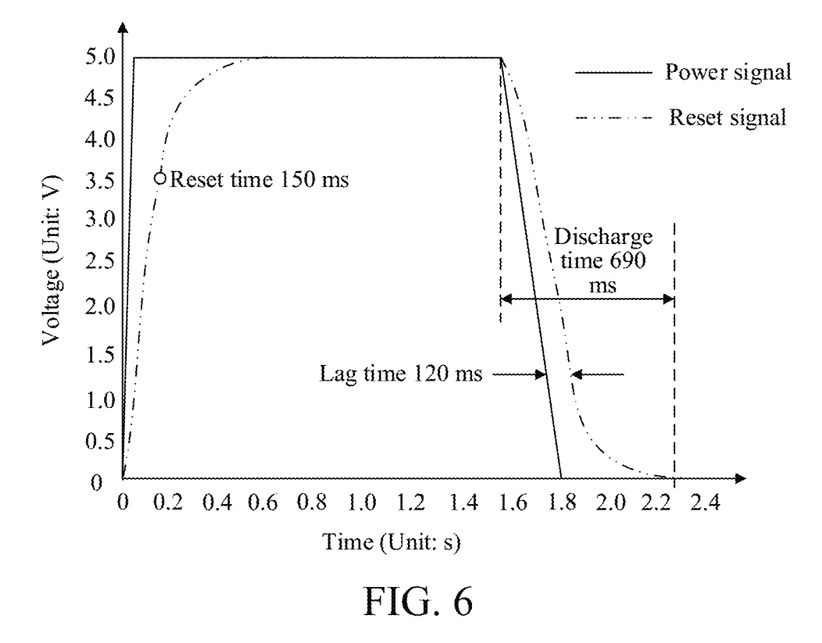
FIG. 6 is a working characteristic diagram of the reset circuit shown in FIG. 5.
Figure 7:
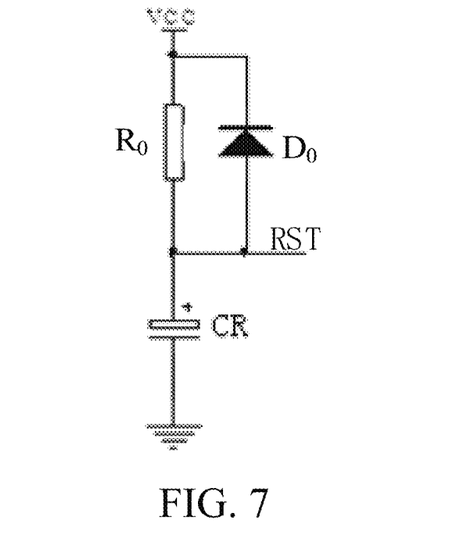
FIG. 7 is a circuit diagram of another reset circuit of an existing microcontroller.

A reset circuit of a current common conventional microcontroller is shown in FIG. 5. A reset resistor $R_0$ is connected in series to a reset capacitor CR. One end of the series circuit is connected to the direct-current stabilized power supply VCC, and the other end of the series circuit is connected to the ground of direct-current stabilized power supply. A common terminal of the reset resistor $R_0$ and the reset capacitor CR is connected to an RST pin of the microcontroller. An operating waveform of the reset circuit shown in FIG. 5 is shown in FIG. 6. When the system is powered up, the direct-current stabilized power supply VCC mainly charges the reset capacitor CR through the reset resistor $R_0$ to generate a reset signal. In this case, the microcontroller is still not in an operating state. When the power supply is down, electricity discharged from the reset capacitor CR directly impacts the RST pin of the microcontroller. As can be seen from FIG. 6, when the power supply is turned on or off, a voltage change at the RST pin of the microcontroller satisfies the feature of an external trigger condition to cause a latchup of the microcontroller. For this problem, in one existing improvement method, a diode Do is connected in parallel at two ends of the reset resistor $R_0$. As shown in FIG. 7, compared with the reset circuit shown in FIG. 5, a diode discharge circuit is added to the reset circuit shown in FIG. 7. However, limited by a drop characteristic of the power supply, the discharge for the RST pin of the microcontroller still cannot be avoided. When the system is continuously rapidly powered on and off, such impact becomes frequent, making a major trigger factor for a latchup of the microcontroller.

Figure 8:
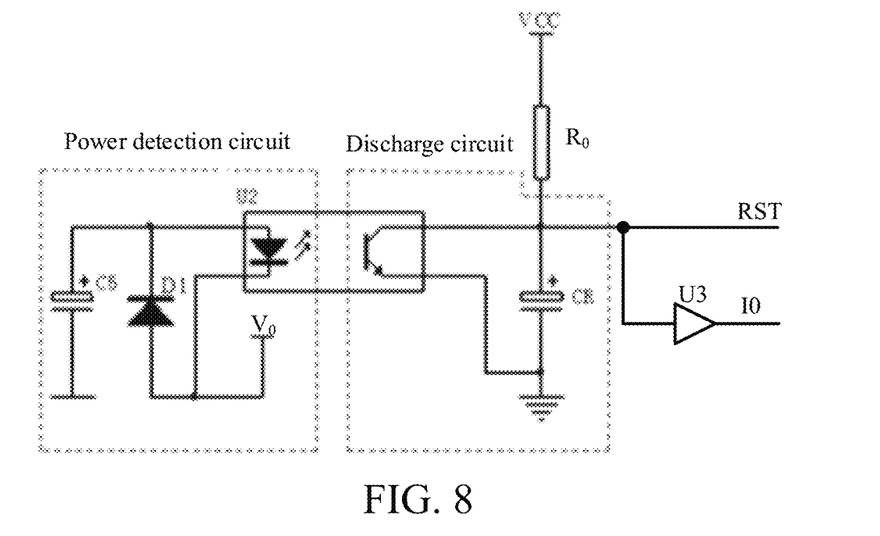
FIG. 8 is a circuit diagram of a reset circuit in a reset circuit design.

To resolve this problem, a new reset circuit is designed in this application. The reset circuit in this application includes three parts: a first-order reset circuit, a power detection circuit, and a discharge circuit. The power detection circuit is connected to the discharge circuit by an optocoupler U2. The circuit parts are connected by signal wires. A specific description is provided as follows:

(1) First-Order Reset Circuit

It should be noted that the first-order reset circuit may be considered as the reset circuit shown in FIG. 5. Therefore, the symbols same as those in FIG. 5 are used for the reset resistor $R_0$ and the reset capacitor CR in the first-order reset circuit. The first-order reset circuit includes a first reset element and a second reset element. One end of the first reset element is connected to the direct-current stabilized power supply VCC. The other end of the first reset element is connected to one end of the second reset element. The other end of the second reset element is connected to the ground of direct-current stabilized power supply. The first reset element is the reset resistor $R_0$, and the second reset element is the reset capacitor CR. Alternatively, the first reset element is the reset capacitor CR, and the second reset element is the reset resistor $R_0$.

Specifically, when the microcontroller is a low-level reset microcontroller, the first reset element is a reset resistor $R_0$, and the second reset element is a reset capacitor CR. A positive electrode of the reset capacitor CR is connected to one end of the reset resistor $R_0$. A negative electrode of the reset capacitor CR is connected to the ground of direct-current stabilized power supply. The other end of the reset resistor $R_0$ is connected to the direct-current stabilized power supply VCC. The first-order reset circuit forms a first-order integrated reset circuit. This application is described by using this case as an example. For a circuit diagram of the reset circuit, refer to FIG. 8.

When the microcontroller is a high-level reset microcontroller, the first reset element in the first-order reset circuit is a reset capacitor CR, and the second reset element is a reset resistor $R_0$. A positive electrode of the reset capacitor CR is connected to the direct-current stabilized power supply. A negative electrode of the reset capacitor CR is connected to one end of the reset resistor $R_0$. The other end of the reset resistor $R_0$ is connected to the ground of direct-current stabilized power supply. The first-order reset circuit forms a first-order differential reset circuit. Based on the circuit diagram shown in FIG. 8, a person skilled in the art may explicitly obtain the circuit diagram of the reset circuit in this case. Details are not described again in this application.

(2) Power Detection Circuit

The power detection circuit includes a fifth capacitor C5, a first diode D1, and a light-emitting diode that is located inside the optocoupler U2. An anode of the first diode D1 and a cathode of the light-emitting diode are separately connected to a detection power supply $V_0$. A positive electrode of the fifth capacitor C5 and a cathode of the first diode D1 are separately connected to an anode of the light-emitting diode. A negative electrode of the fifth capacitor C5 is connected to a detection power ground.

(3) Discharge Circuit

The discharge circuit includes a bipolar phototransistor inside the optocoupler U2 and the second reset element in the first-order reset circuit. An emitter of the bipolar phototransistor is connected to the ground of direct-current stabilized power supply. A collector of the bipolar phototransistor is connected to a common terminal of the first reset element and the second reset element. The common terminal of the first reset element and the second reset element is further connected to the RST pin of the microcontroller. The common terminal of the first reset element and the second reset element is further connected to an input terminal of a CMOS buffer U3. An output terminal of the CMOS buffer U3 is connected to an external interrupt of the microcontroller. The external interrupt is usually set with the highest priority level, to form the reset circuit, reacting in chain with the interrupt, of a latchup immune microcontroller.

In the reset circuit of this application, the reset resistor $R_0$, the reset capacitor CR, and the collector of the bipolar phototransistor inside the optocoupler U2 are connected together, and are directly connected to the RST pin of the microcontroller without any intermediate buffer. An "optical trigger" mechanism is used to enable the power detection circuit and the discharge circuit to react in chain. When the power supply is down, electrical charges at an end of the RST pin is directly released through the discharge circuit, so as to minimize the impact on the RST pin of the microcontroller, making it more likely for a CMOS microcontroller to enter a latchup state. For example, a microcontroller interrupt (assumed to be I0) connected to the CMOS buffer U3 is set to be triggered by a falling edge, and the priority level is set to the highest. An operating process of the entire reset circuit when the system is powered on and off is as follows:

When the direct-current stabilized power supply VCC is powered up, because of a transient effect during the charging of the reset capacitor CR, an initial potential of the voltage at the positive electrode of the reset capacitor CR is equal to the ground of direct-current stabilized power supply. After a particular delay time, the charging of the reset capacitor CR is completed. In this process, the voltage at the positive electrode of the reset capacitor CR gradually becomes a high level. The process is used to provide a reset signal to the microcontroller. In this process, the microcontroller is in a reset process and is not in an operating state yet. The output terminal of the CMOS buffer U3 is at a low level, and the interrupt I0 does not work. In this process, the length of the delay time depends on the values of the reset resistor $R_0$ and the reset capacitor CR. Specific values of the reset resistor $R_0$ and the reset capacitor CR may be used to determine the delay time according to a functional requirement of a designed object. $R_0*CR$ is referred to as a time constant.

During power-on and normal operation, the first diode D1 in the power detection circuit is in forward conduction. The light-emitting diode inside the optocoupler U2 is in reverse conduction and is not turned on. Therefore, the bipolar phototransistor inside the optocoupler U2 is also not in conduction, and the discharge circuit is in an off state, the operation of the first-order reset circuit is not affected, and the microcontroller operates normally. In this case, the output terminal of the CMOS buffer U3 is at a high level. In this process, the interrupt I0 also does not work. Meanwhile, the detection power supply $V_O$ in the power detection circuit charges the fifth capacitor C5 through the first diode D1 to store energy. After the charging is completed, the voltage at the positive electrode of the fifth capacitor C5 is equal to that of the detection power supply $V_O$.

When the detection power supply $V_O$ is down, the voltage of the detection power supply $V_O$ decreases. In this case, the voltage at the positive electrode of the fifth capacitor C5 in the power detection circuit is higher than that of the detection power supply $V_O$. The first diode D1 is reversely powered on and is not in conduction. The light-emitting diode inside the optocoupler U2 is in forward conduction. The electrical energy stored in the fifth capacitor C5 is released to the detection power supply $V_O$ through the light-emitting diode to form a current, so as to trigger the bipolar phototransistor inside the optocoupler U2 to be in conduction. The discharge circuit is closed. The electrical energy stored in the reset capacitor CR in the first-order reset circuit forms approximately direct discharge to the ground through the bipolar phototransistor, so as to avoid the impact of the discharge of the reset capacitor CR on the RST pin of the microcontroller. Meanwhile, with the conduction of the discharge circuit, the CMOS buffer U3 changes from a high level to a low level. That is, a falling edge is generated. In this case, the microcontroller immediately enters a process of the interrupt I0 processing. In this process, the program first immediately stores all operation data, and then sequentially turns off all output terminals. That is, before the direct-current stabilized power supply VCC actually falls, the interrupt I0 and the discharge circuit react in chain in time, to sequentially complete the storage of data and the switching off of the output terminals, so that data loss caused by a sudden power cut and reset and impact on a CMOS circuit caused by sudden switching off of all the output terminals are avoided, thereby effectively preventing the formation of an external condition of a latchup of the microcontroller to a particular extent.

For the detection power supply $V_O$, the meaning is as follows: As described above, the utility power is sequentially transformed, rectified, and stabilized to obtain the direct-current stabilized power supply VCC. The stabilization stage usually includes a three-terminal voltage stabilizer or another form of switched-mode voltage stabilization technology, and generally includes a large number of capacitors. Therefore, when the utility power is down, the direct-current stabilized power supply VCC usually starts to fall after a millisecond-level or second-level lag behind the utility power.

When the duration during which an output change of the direct-current stabilized power supply VCC lags behind an output change of the utility power does not reach preset duration, that is, usually, when the lag is less than a millisecond, it indicates that the power supply has relatively small inertia. A "common power supply" method may be used for the reset circuit. That is, the power detection circuit and the microcontroller share the direct-current stabilized power supply VCC. That is, the detection power supply $V_O$ is the direct-current stabilized power supply VCC, and the detection power ground is the ground of direct-current stabilized power supply.

When the duration during which the output change of the direct-current stabilized power supply VCC lags behind the output change of the utility power reaches the preset duration, that is, usually, when the lag is milliseconds or even seconds long, it indicates that the power supply has relatively large inertia. The "common power supply" method cannot actually immediately detect an actual power down symptom of the utility power. In this case, an "isolated preset supply" method may be used. That is, the rectified direct-current power supply VZ is used for the power detection circuit, so that an actual power down of the utility power is detected in advance. The direct-current power supply VZ in a rectified output stage already outputs direct current. Although the direct current is not stable, with appropriate selection of the fifth capacitor C5, the insensitivity to power supply fluctuations in this stage may be implemented. If the utility power undergoes common fluctuations, the discharge of the reset capacitor CR is not triggered. The light-emitting diode inside the optocoupler U2 triggers the conduction of the bipolar phototransistor only when the utility power is actually down and the voltage amplitude decreases to a particular degree, to enable the reset capacitor CR to rapidly discharge, thereby greatly reducing the change time during which the reset signal lags behind the direct-current stabilized power supply VCC, thereby avoiding the risk that the CMOS circuit enters a latchup caused by unstable signals when the direct-current stabilized power supply VCC falls. To put it simply, the "isolated power supply" detection method can implement beforehand processing. That is, the actual power down of the utility power is detected in advance, and the discharge circuit is turned on in advance, so that the level at an end of the RST pin of the microcontroller changes synchronously with the direct-current stabilized power supply VCC or even changes sooner than the direct-current stabilized power supply VCC, so as to rapidly release charges and enter a reset state, thereby effectively avoiding the risk that a CMOS microcontroller circuit enters a latchup.

The reset circuit in this application has the compatibility of a "common power supply technology" and an "isolated power supply technology", so that choices may be made according to an actual case to achieve better effectiveness and adaptability.

4. I/O Port Design

For an external trigger condition that tends to cause a latchup of the microcontroller, the following measures are adopted to reduce an external latchup risk triggered by an I/O port.

(1) An optocoupler element is used to perform isolated transmission of an input signal and an output signal. This is a relatively common approach at present. Details are not described in this application.

(2) The drive capability of an I/O port is fully considered. Generally, one TTL port drives eight TTL ports or 10 CMOS ports, and one CMOS port drives two TTL ports and 20 CMOS ports. If the load is excessively heavy, the microcontroller may operate unstably.

(3) An idle pin of the microcontroller is set to output, or is connected to the direct-current stabilized power supply VCC by a pull-up resistor, or is connected to the ground of direct-current stabilized power supply by a pull-down resistor. The resistance values of the pull-up resistor and the pull-down resistor may be selected according to an actual case, and may be, for example, 1 kΩ.

(4) An input signal processing circuit is used to process an input signal. The input signal is compared with a reference voltage to improve the "quality" of the input signal. This is equivalent to raising an "admission threshold" for the input signal. Useless external noise signals are intercepted, thereby improving the latchup immune capability of the microcontroller against an external input signal.

Figure 9:
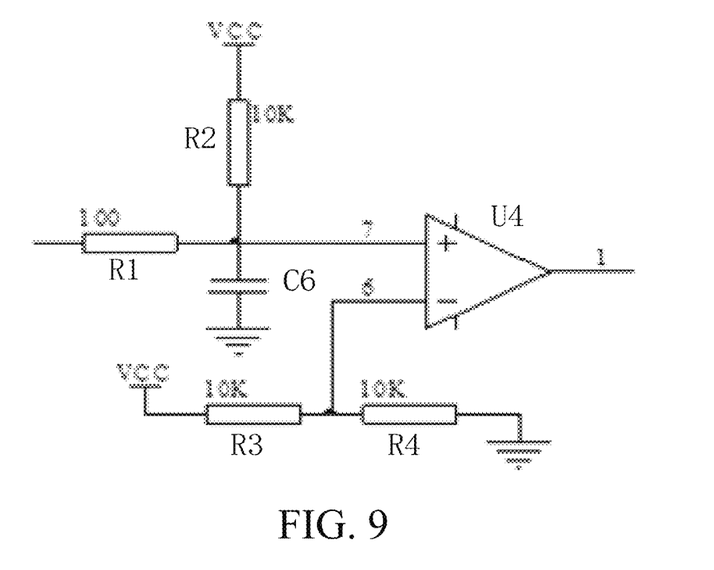
FIG. 9 is a circuit diagram of an input signal processing circuit in an I/O port design.

For (4) in the foregoing, refer to FIG. 9 for the circuit diagram of the input signal processing circuit. The input signal processing circuit includes a first resistor R1, a second resistor R2, a sixth capacitor C6, a third resistor R3, a fourth resistor R4, and a comparator U4. One end of the first resistor R1 is connected to the input signal. The other end of the first resistor R1 is separately connected to one end of the second resistor R2, one end of the sixth capacitor C6, and a positive input terminal of the comparator U4. The other end of the second resistor R2 is connected to the direct-current stabilized power supply VCC. The other end of the sixth capacitor C6 is connected to the ground of direct-current stabilized power supply. One end of the third resistor R3 is connected to the direct-current stabilized power supply VCC. The other end of the third resistor R3 is connected to one end of the fourth resistor R4. The other end of the fourth resistor R4 is connected to the ground of direct-current stabilized power supply. A common terminal of the third resistor R3 and the fourth resistor R4 is connected to a negative input terminal of the comparator U4 and provides the reference voltage. An output terminal of the comparator U4 is connected to a signal input terminal of the microcontroller.

The foregoing provides only preferred implementations of this application. The present invention is not limited to the foregoing embodiments. It may be understood that other improvements and changes that are directly derived or conceived by a person skilled in the art without departing from the spirit and concept of the present invention shall all fall within the protection scope of the present invention.

What is claimed is:

1. A latchup immune microcontroller system, comprising a microcontroller, a clock circuit, a power supply circuit, a reset circuit, and an input signal processing circuit, wherein
the clock circuit comprises a first capacitor, a crystal oscillator, and a second capacitor that are sequentially connected in series to form a series circuit, wherein two ends of the series circuit are connected, a common terminal of the first capacitor and the crystal oscillator is connected to an XTAL1 pin of the microcontroller, a common terminal of the crystal oscillator and the second capacitor is connected to an XTAL2 pin of the microcontroller, and a common terminal of the first capacitor and the second capacitor is connected to a direct-current stabilized power supply at a common ground;
the power supply circuit comprises the direct-current stabilized power supply and a filter circuit, wherein the filter circuit comprises a third capacitor, a filter inductor, and a fourth capacitor that are sequentially connected in series to form the series circuit, wherein two ends of the series circuit are connected, a common terminal of the third capacitor and the filter inductor is connected as an input terminal of the filter circuit to the direct-current stabilized power supply, a common terminal of the filter inductor and the fourth capacitor is connected as an output terminal of the filter circuit to a VCC pin of the microcontroller, and a common terminal of the third capacitor and the fourth capacitor is connected to a GND pin of the microcontroller and is connected to the direct-current stabilized power supply at the common ground;
the reset circuit comprises a first-order reset circuit, a power detection circuit, and a discharge circuit, the first-order reset circuit comprises a first reset element and a second reset element, wherein a first end of the first reset element is connected to the direct-current stabilized power supply, a second end of the first reset element is connected to a first end of the second reset element, a second end of the second reset element is connected to the direct-current stabilized power supply at the common ground, the power detection circuit is connected to the discharge circuit by an optocoupler, the power detection circuit comprises a fifth capacitor, a first diode, and a light-emitting diode that is located inside the optocoupler, an anode of the first diode and a cathode of the light-emitting diode are separately connected to a detection power supply, a positive electrode of the fifth capacitor and a cathode of the first diode are separately connected to an anode of the light-emitting diode, a negative electrode of the fifth capacitor is connected to a detection power ground, the discharge circuit comprises a bipolar phototransistor inside the optocoupler and the second reset element in the first-order reset circuit, an emitter of the bipolar phototransistor is connected to the direct-current stabilized power supply at the common ground, a collector of the bipolar phototransistor is connected to a common terminal of the first reset element and the second reset element, the common terminal of the first reset element and the second reset element is further connected to an RST pin of the microcontroller, the common terminal of the first reset element and the second reset element is further connected to an input terminal of a CMOS buffer, and an output terminal of the CMOS buffer is connected to an external interrupt of the microcontroller, wherein the first reset element is a reset resistor, and the second reset element is a reset capacitor, or the first reset element is a reset capacitor, and the second reset element is a reset resistor; and
the input signal processing circuit comprises a first resistor, a second resistor, a sixth capacitor, a third resistor, a fourth resistor, and a comparator, a first end of the first resistor is connected to an input signal, a second end of the first resistor is separately connected to a first end of the second resistor, a first end of the sixth capacitor, and a positive input terminal of the comparator, a second end of the second resistor is connected to the direct-current stabilized power supply, a second end of the sixth capacitor is connected to the direct-current stabilized power supply at the common ground, a first end of the third resistor is connected to the direct-current stabilized power supply, a second end of the third resistor is connected to Jane a first end of the fourth resistor, a second end of the fourth resistor is connected to the ground of the direct-current stabilized power supply, a common terminal of the third resistor and the fourth resistor is connected to a negative input terminal of the comparator and provides a reference voltage, and an output terminal of the comparator is connected to a signal input terminal of the microcontroller.

2. The system according to claim 1, wherein the direct-current stabilized power supply is formed by processing utility power, the utility power is transformed to obtain a low-voltage power supply, the low-voltage power supply is rectified to obtain a direct-current power supply, and the direct-current power supply is stabilized to obtain the direct-current stabilized power supply;

when the duration during which an output change of the direct-current stabilized power supply lags behind an output change of the utility power does not reach preset duration, the detection power supply is the direct-current stabilized power supply, and the detection power ground is the ground of the direct-current stabilized power supply; and     when the duration during which the output change of the direct-current stabilized power supply lags behind the output change of the utility power reaches the preset duration, the detection power supply is the direct-current power supply, and the detection power ground is the direct-current power ground.

3. The system according to claim 2, wherein
the utility power passes through a switched-mode power supply to obtain the direct-current stabilized power supply; or
the utility power sequentially passes through a transformer and a linear power supply to obtain the direct-current stabilized power supply, the transformer comprises a shielding layer, the shielding layer is grounded, a secondary winding of the transformer comprises a plurality of power loops formed by windings, and the power loops do not have a common ground.

4. The system according to claim 1, wherein a clock frequency of the clock circuit is a frequency determined by adding a preset margin to a measured frequency, and the measured frequency is a frequency calculated according to a minimum time of completing real-time events by the microcontroller system.

5. The system according to claim 1, wherein when the microcontroller system uses printed circuit board (PCB) wiring, the crystal oscillator in the clock circuit is adjacent to the microcontroller, and a housing of the crystal oscillator is grounded, exterior of the clock circuit is surrounded by a grounding wire, and no other signal wire is arranged below the clock circuit.

6. The system according to claim 1, wherein
when the microcontroller is a low-level reset microcontroller, the first reset element in the first-order reset circuit is a reset resistor, and the second reset element is a reset capacitor, wherein a positive electrode of the reset capacitor is connected to one end of the reset resistor, a negative electrode of the reset capacitor is connected to the ground of direct-current stabilized power supply, the other end of the reset resistor is connected to the direct-current stabilized power supply, and the first-order reset circuit forms a first-order integrated reset circuit; and when the microcontroller is a high-level reset microcontroller, the first reset element in the first-order reset circuit is a reset capacitor, and the second reset element is a reset resistor, wherein a positive electrode of the reset capacitor is connected to the direct-current stabilized power supply, a negative electrode of the reset capacitor is connected to one end of the reset resistor, the other end of the reset resistor is connected to the ground of direct-current stabilized power supply, and the first-order reset circuit forms a first-order differential reset circuit.

7. The system according to claim 1, wherein an optocoupler element is used to perform isolated transmission of an input signal and an output signal of the microcontroller, one transistor-transistor logic (TTL) port of the microcontroller drives at most eight TTL ports or 10 CMOS ports, one CMOS port of the microcontroller drives at most two TTL ports and 20 CMOS ports, and an idle pin of the microcontroller is set to output, or is connected to the direct-current stabilized power supply by a pull-up resistor, or is connected to the ground of direct-current stabilized power supply by a pull-down resistor.

* * * * *